US012689355B2

(12) United States Patent
Yen et al.

(10) Patent No.: US 12,689,355 B2
(45) Date of Patent: Jul. 21, 2026

(54) BULK ACOUSTIC WAVE RESONATOR WITH AN INTEGRATED PASSIVE DEVICE FABRICATED USING BUMP PROCESS

(71) Applicant: Texas Instruments Incorporated, Dallas, TX (US)

(72) Inventors: Ting-Ta Yen, San Jose, CA (US); Yao Yu, San Jose, CA (US); Hassan Omar Ali, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 584 days.

(21) Appl. No.: 17/389,619

(22) Filed: Jul. 30, 2021

(65) Prior Publication Data

US 2023/0033082 A1 Feb. 2, 2023

(51) Int. Cl.
| | |
|---|---|
| *H03H 9/54* | (2006.01) |
| *H03H 9/02* | (2006.01) |
| *H03H 9/17* | (2006.01) |
| H03H 9/60 | (2006.01) |

(52) U.S. Cl.
CPC ........ *H03H 9/542* (2013.01); *H03H 9/02007* (2013.01); *H03H 9/17* (2013.01); *H03H 9/60* (2013.01)

(58) Field of Classification Search
CPC ........ H03H 9/54; H03H 9/17; H03H 9/02007; H03H 9/542
USPC ................................................ 333/186, 193
See application file for complete search history.

(56) References Cited

U.S. PATENT DOCUMENTS

| | | | |
|---|---|---|---|
| 5,541,135 A | 7/1996 | Pfeifer et al. | |
| 2002/0160576 A1 | 10/2002 | Basteres et al. | |
| 2005/0167780 A1 | 8/2005 | Edelstein et al. | |
| 2009/0140359 A1* | 6/2009 | Nakashiba | H01L 28/10 |
| | | | 257/E29.323 |
| 2015/0333019 A1* | 11/2015 | Lee | H10D 1/20 |
| | | | 257/508 |
| 2018/0048291 A1 | 2/2018 | Cheon | |
| 2020/0235716 A1* | 7/2020 | Eid | H01L 23/66 |
| 2020/0287520 A1* | 9/2020 | Kamgaing | H03H 9/1014 |

FOREIGN PATENT DOCUMENTS

WO WO2019132937 A1 7/2019

OTHER PUBLICATIONS

International Searching Authority, Communication Relating to the Results of the Partial International Search, Nov. 23, 2022, 16 pages.

* cited by examiner

*Primary Examiner* — Rakesh B Patel
(74) *Attorney, Agent, or Firm* — Zhenhai Fu; Frank D. Cimino

(57) ABSTRACT

A circuit includes a semiconductor substrate and an integrated passive device. The integrated passive device is on a surface of the semiconductor substrate. The integrated passive device is in a metal layer on the semiconductor substrate. The metal layer is at least tens of micrometers thick. The integrated passive device may be an inductor or a capacitor in some examples.

20 Claims, 10 Drawing Sheets

BULK ACOUSTIC WAVE RESONATOR WITH AN INTEGRATED PASSIVE DEVICE FABRICATED USING BUMP PROCESS

BACKGROUND

Passive devices, such as inductors, capacitors, and resistors, are commonly used in electronic circuits. Like transistors, passive devices may be fabricated by patterning the various layers (e.g., metal, insulator, etc.) of an integrated circuit. For example, an inductor may be fabricated by etching a metal layer to create a desired inductor pattern. Similarly, a capacitor may be fabricated by etching a metal layer to create the top and bottom plates of the capacitor.

SUMMARY

In one example, a circuit includes a semiconductor substrate and an integrated passive device. The integrated passive device is on a surface of the semiconductor substrate. The integrated passive device is in a metal layer on the semiconductor substrate. The metal layer is at least tens of micrometers thick.

In another example, a resonator circuit includes a semiconductor substrate. A bulk acoustic wave resonator is on the semiconductor substrate. A metal layer that is at least tens of micrometers thick is also on a surface of the semiconductor substrate. The metal layer is patterned to form an inductor coupled to the bulk acoustic wave resonator.

In a further example, a radio frequency (RF) circuit includes a semiconductor substrate. A metal layer is on a surface of the semiconductor substrate. The metal layer is at least 30 micrometers thick. The metal layer is patterned to form a first I/O terminal, a second I/O terminal, and an inductor. The inductor includes a terminal coupled to the first I/O terminal.

BRIEF DESCRIPTION OF THE DRAWINGS

FIG. 1C is a graph of frequency versus amplitude for the resonator circuit of FIG. 1.

DETAILED DESCRIPTION

Passive components fabricated using complementary metal oxide semiconductor (CMOS) or micro-electro-mechanical system (MEMS) metal may be limited by the thickness of the metal layers. For example, a metal layer in a MEMS or CMOS process may be 1-2 micrometers (μm) thick. Inductors fabricated using such relatively thin metal have a poor quality factor (Q), $$Q = \frac{\omega L}{R},$$

where:
R is the DC resistance of the inductor;
L is the inductance of the inductor; and
ωL is inductive reactance.

Inductors and capacitors are used in a variety of circuits. For example, inductors may be used in bulk acoustic wave (BAW) resonator circuits and matching networks may be used to couple radio frequency (RF) components. Conventional circuits may use the low-Q inductors fabricated using MEMS or CMOS metal processes, or use inductors and capacitors external to the integrated circuit. A BAW resonator's tuning range and filter bandwidth are limited by the effective coupling ($K_{eff}^2$) of constituent BAW resonators. A low $K_{eff}^2$ (caused by a low-Q inductor) results in a small resonator tuning range and limited filter bandwidth that, in turn, increases yield loss. Use of external inductors and capacitors increases circuit area and cost. For example, use of external inductors in RF matching networks and antennas in an RF system increases the circuit area and cost of the RF system.

The circuits described herein employ passive components (e.g., inductors and capacitors) fabricated as part of the integrated circuit packaging process. The metal electroplated or deposited during the packaging process is much thicker than the metal layers formed in CMOS or MEMS processing. For example, a metal layer electroplated in the packaging process may be 30-100 μm thick, while a metal layer formed in CMOS or MEMS processing may be only 1-2 μm thick. Inductors fabricated using the thicker metal layer may have a high-Q (e.g., 30-50) and be suitable for use in a variety of applications, including BAW resonators and filters, RF matching networks, and antenna miniaturization.

In the circuits described herein, integrated passive components may be created using a bump process that is also used to form I/O terminals (e.g., copper posts of a flip-chip package) on a wafer prior to singulation. In addition to passive components and I/O terminals, the bump process may be used to create a solder seal structure (a seal ring) about circuit or MEMS components. The seal ring isolates and protects the circuit or the MEMS components disposed within the seal ring from packaging materials, such as mold compound.

Figure 1A:
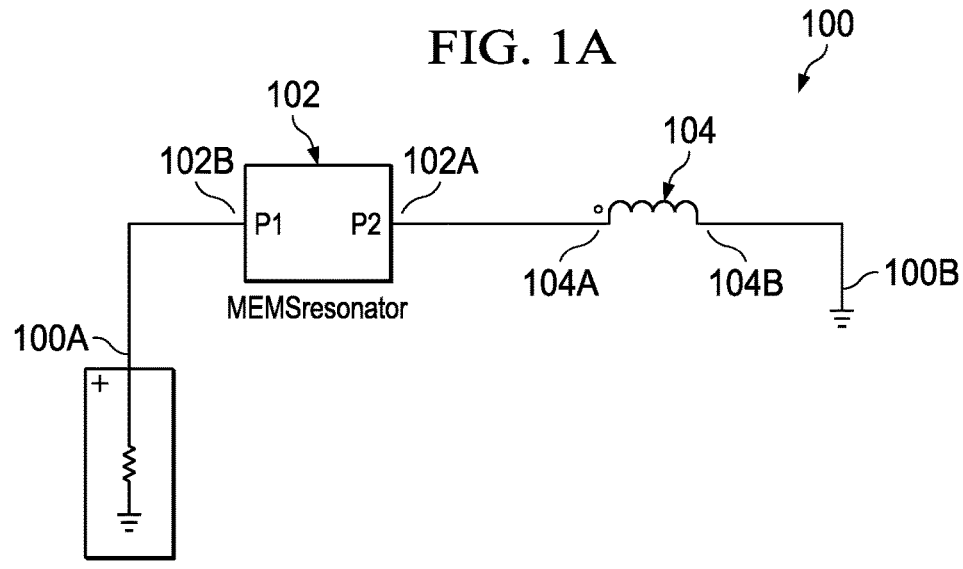
FIG. 1A is a schematic diagram for a resonator circuit using a bulk acoustic wave (BAW) resonator in series with a high-quality factor (Q) inductor.

FIG. 1A is a schematic diagram for a resonator circuit 100 using a bulk acoustic wave (BAW) resonator 102 in series with a high-Q inductor 104. The BAW resonator 102 is a piezoelectric resonator. The inductor 104 is fabricated using a bump process. The metal layer deposited to form the inductor 104 may be 30-100 micrometers thick. The inductor 104 may have Q factor in a range of about 30-50 in some implementations. The resonator circuit 100 includes I/O terminals 100A and 100B that are fabricated using the bump process. The inductor 104 includes a terminal 104A coupled to a terminal 102A of the BAW resonator 102, and a terminal 104B coupled to an I/O terminal 100A. A terminal 102B of the BAW resonator 102 is coupled to the I/O terminal 100B of the resonator circuit 100.

Figure 1A:
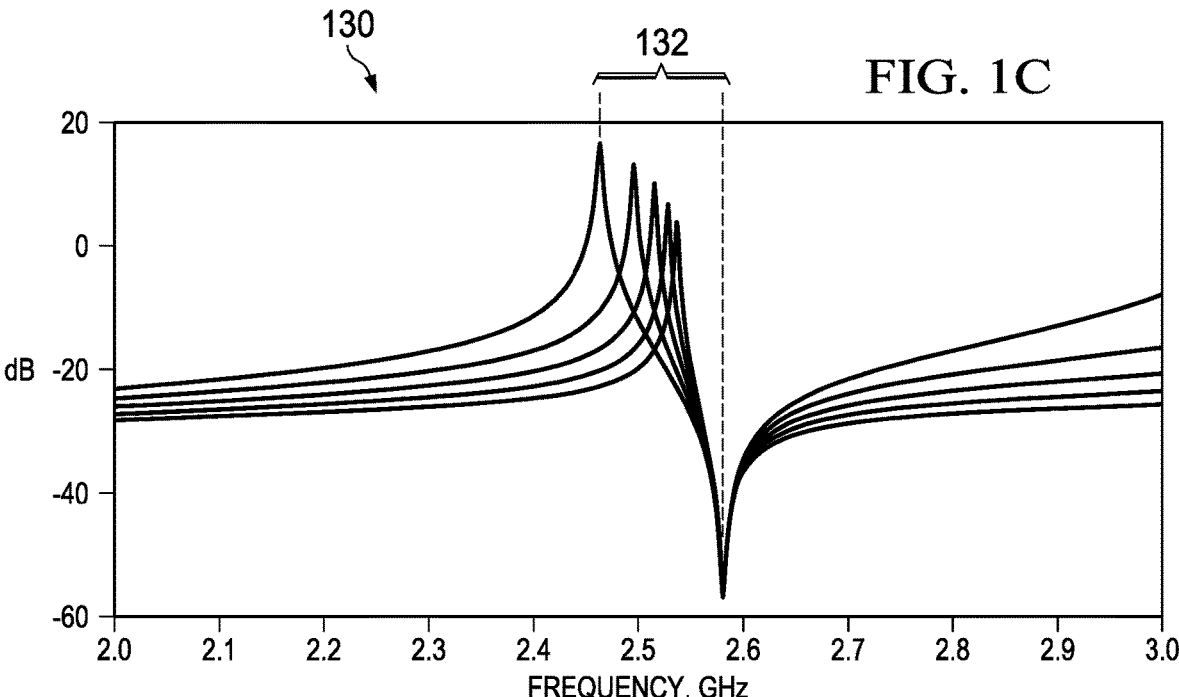
Figure 1B:
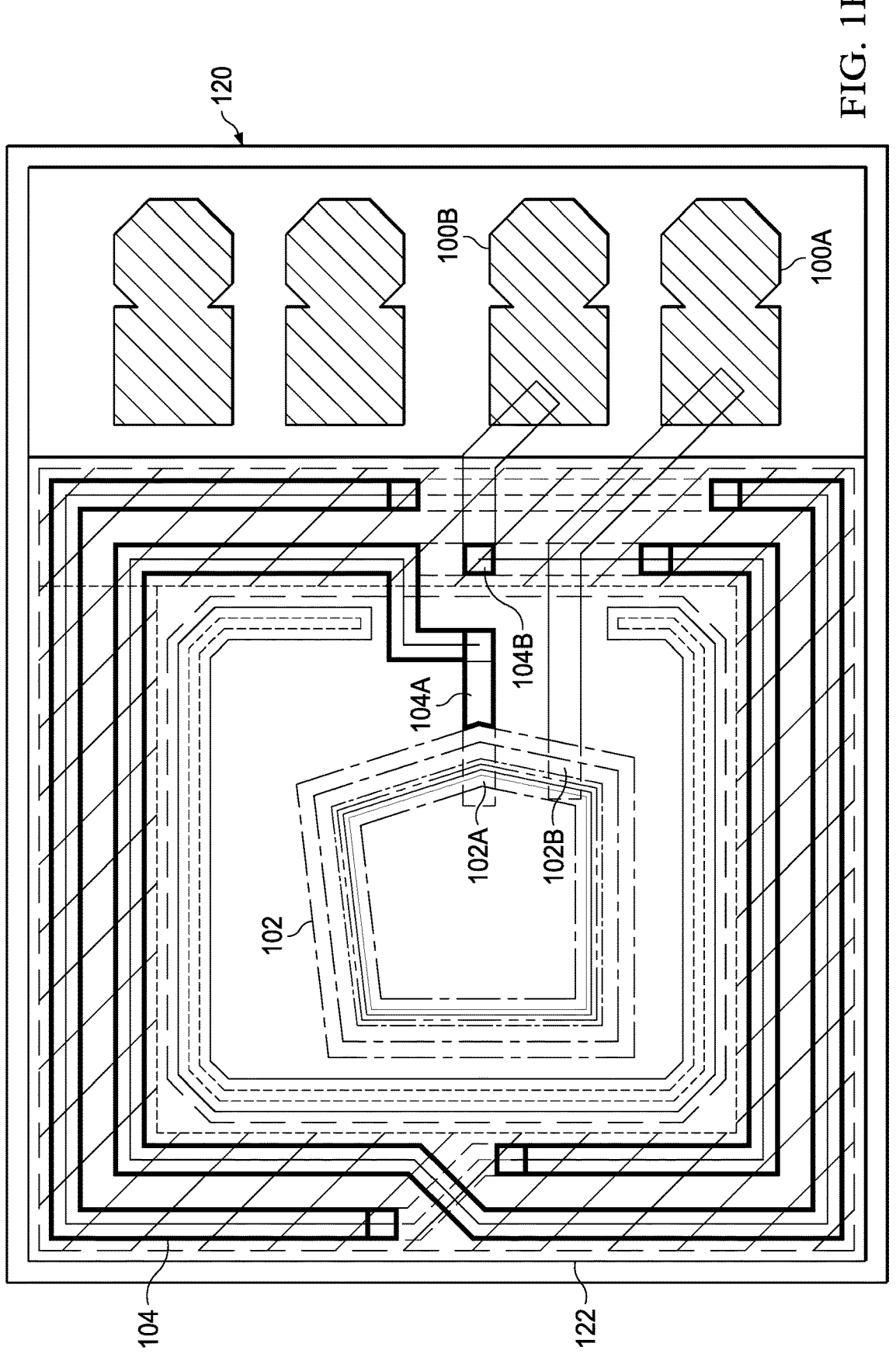
FIG. 1B shows a die that includes a BAW resonator, a high-Q inductor, and I/O terminals configured as in FIG. 1.

FIG. 1B shows a die 120 that includes the BAW resonator 102, the inductor 104, and the I/O terminals 100A and 100B of FIG. 1. The die 120 includes a semiconductor substrate 122 (e.g., a silicon substrate). The BAW resonator 102, the inductor 104, the 100A and the 100B are formed on the semiconductor substrate 122.

FIG. 1C is a graph 130 of frequency versus amplitude for the resonator circuit of FIG. 1. The graph 130 shows the inductor 104 enables a wide tuning range 132 in the resonator circuit 100. The wide tuning range 132 reduces yield loss and cost.

Figure 2A:
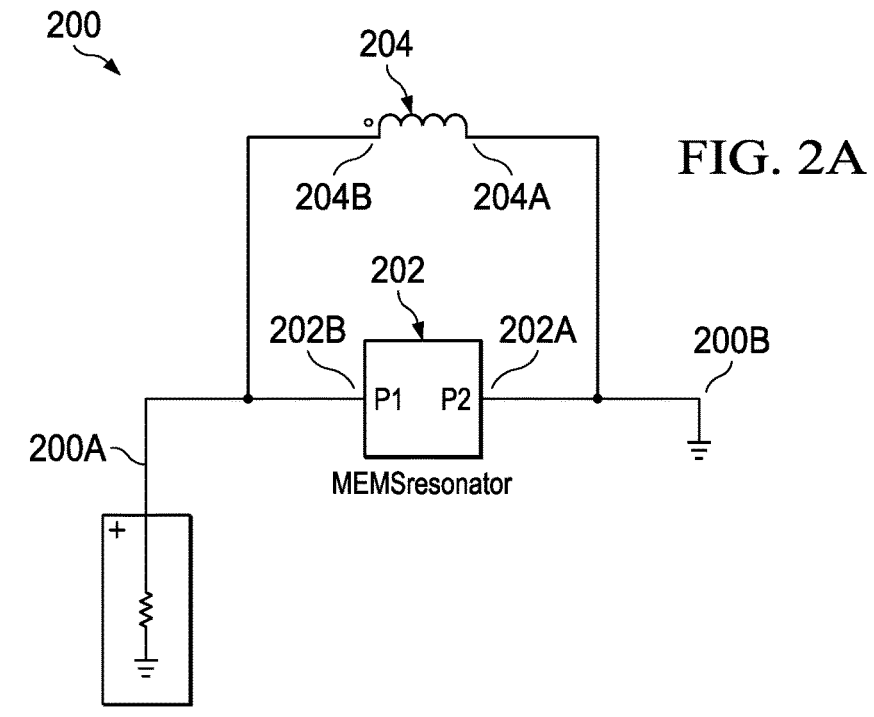
FIG. 2A is a schematic diagram for a resonator circuit using a BAW resonator in parallel with a high-Q inductor.

FIG. 2A is a schematic diagram for a resonator circuit 200 using a bulk acoustic wave (BAW) resonator 202 in parallel with a high Q inductor 204. The inductor 204 is fabricated using a bump process. The metal layer deposited to form the inductor 204 may be 30-100 micrometers thick. The inductor 204 may have Q factor in a range of about 30-50 in some implementations. The resonator circuit 200 includes I/O terminals 200A and 200B that are fabricated using the bump process. The inductor 204 includes a terminal 204A coupled to a terminal 202A of the BAW resonator 202, and a terminal 204B coupled to the terminal 202B of the BAW resonator 202. The terminal 202A is coupled to an I/O terminal 200B of the resonator circuit 200. A terminal 202B of the BAW resonator 202 is coupled to an I/O terminal 200A of the resonator circuit 200.

Figure 2C:
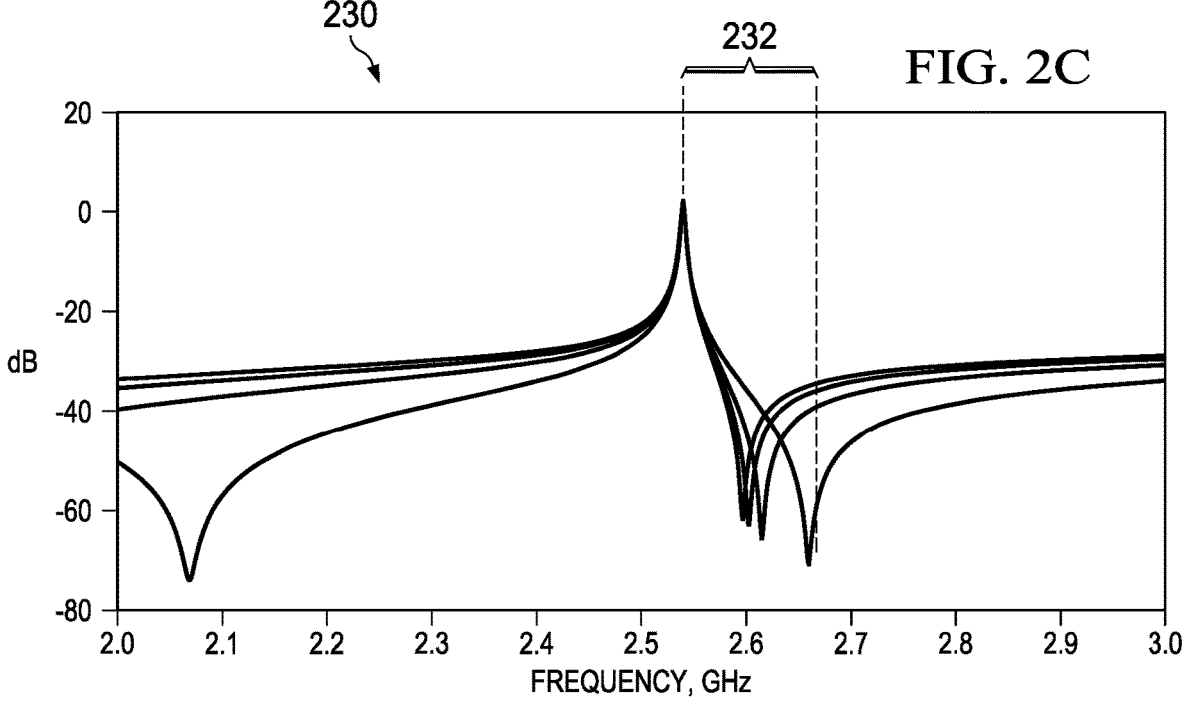
FIG. 2C is a graph of frequency versus amplitude for the resonator circuit of FIG. 4.
Figure 2B:
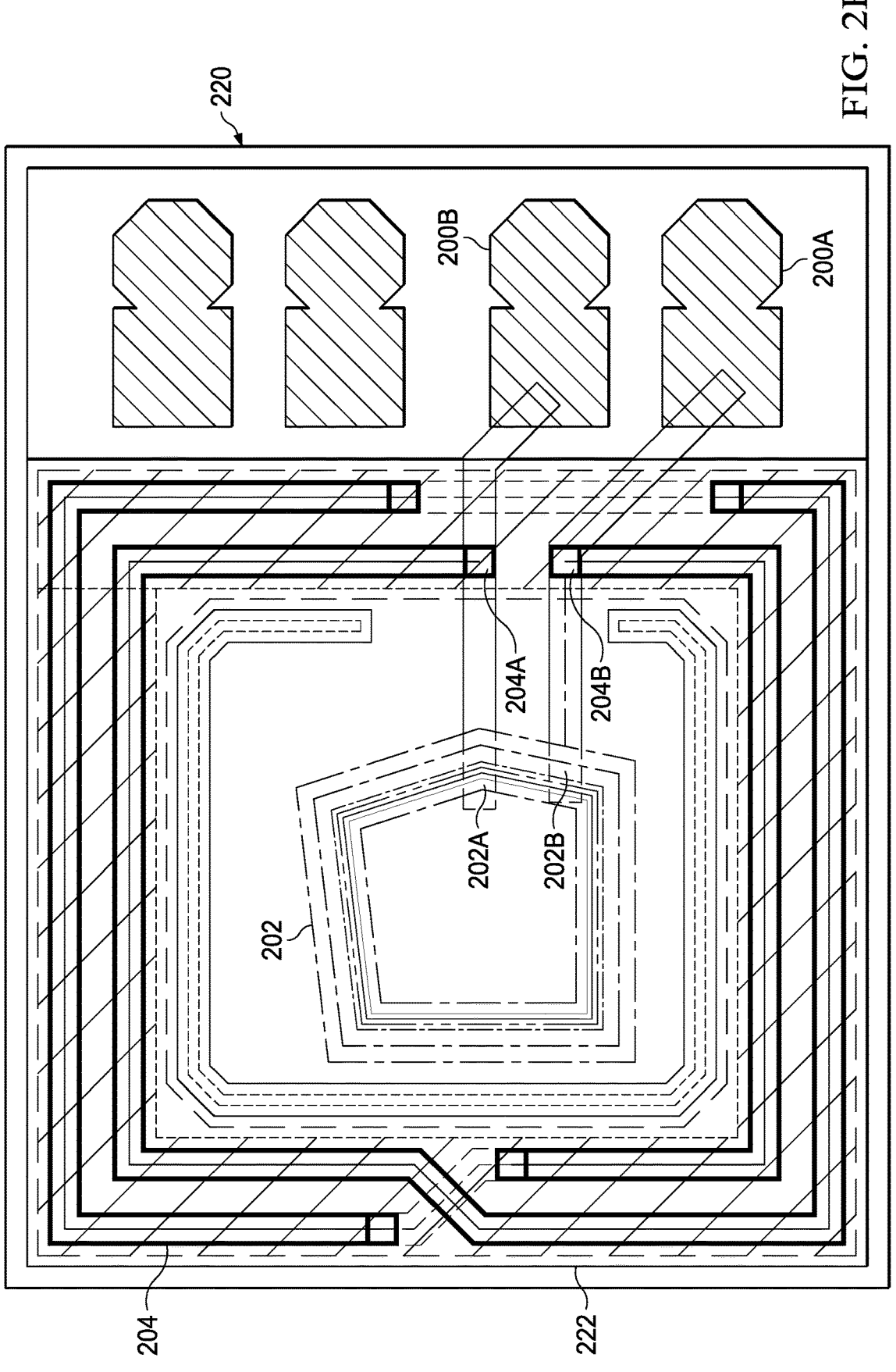
FIG. 2B shows a die that includes a BAW resonator, a high-Q inductor, and I/O terminals configured as in FIG. 4.

FIG. 2B shows a die 220 that includes the BAW resonator 202, the inductor 204, and the I/O terminals 200A and 200B of FIG. 4. The die 220 includes a semiconductor substrate 222. The BAW resonator 202, the inductor 204, the 200A and the 200B are formed on the semiconductor substrate 222.

FIG. 2C is a graph 230 of frequency versus amplitude for the resonator circuit of FIG. 4. The graph 230 shows that the inductor 204 enables a wide tuning range 232 in the resonator circuit 200. The wide tuning range 232 reduces yield loss and cost.

Figure 3A:
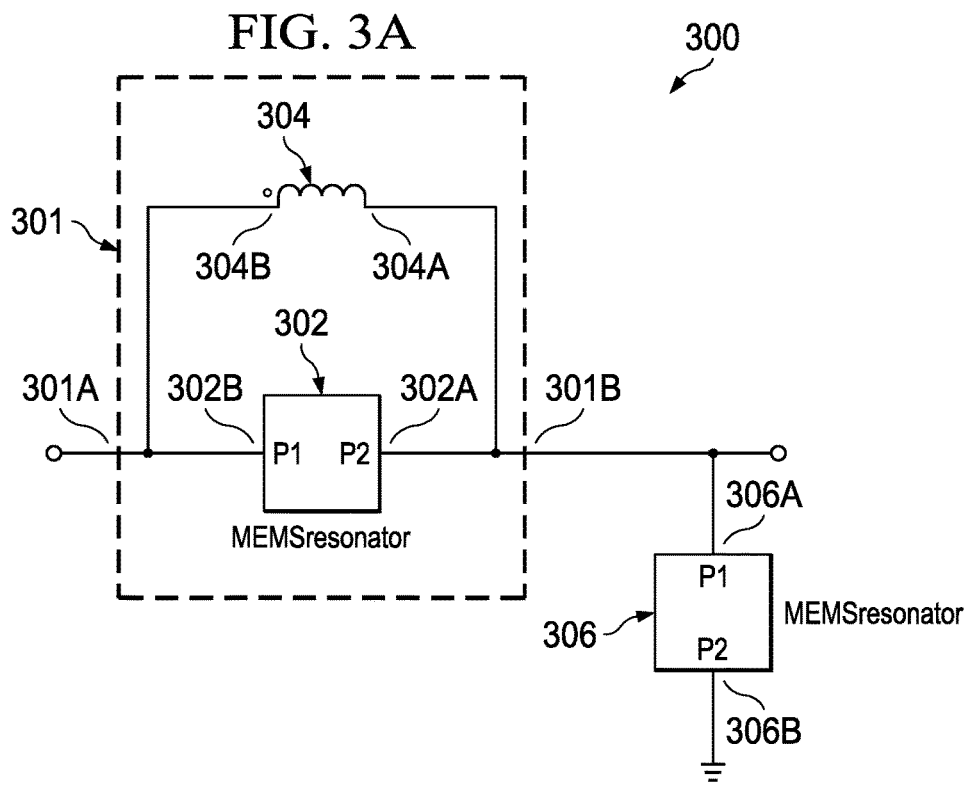
FIG. 3A is a schematic diagram for a filter circuit that includes a BAW resonator in parallel with a high-Q inductor.

FIG. 3A is a schematic diagram for a filter circuit 300 that includes a BAW resonator 302 in parallel with a high-Q inductor 304 (both are in a series branch), and a BAW resonator 306 in a parallel branch. The BAW resonator 302 and the inductor 304 may be disposed on a same die 301, as shown in FIG. 2B. The filter circuit 300 also includes a second BAW resonator 306. The BAW resonator 306 may be disposed on the die 301, or disposed on a different die. The inductor 304 is fabricated using a bump process. The metal layer deposited to form the inductor 304 may be 30-100 micrometers thick. The inductor 304 may have Q factor in a range of about 30-50 in some implementations. The die 301 includes I/O terminals 301A and 301B that are fabricated using the bump process. The inductor 304 includes terminals 304A and 304B respectively coupled to terminals 302A and 302B of the BAW resonator 302. The terminal 302A is coupled to an I/O terminal 301B of the die 301. A terminal 302B of the BAW resonator 302 is coupled to an I/O terminal 301A of the die 301. The BAW resonator 306 includes a terminal 306A coupled to the I/O terminal 301B. A terminal 306B of the BAW resonator 306 is coupled to ground.

Figure 3B:
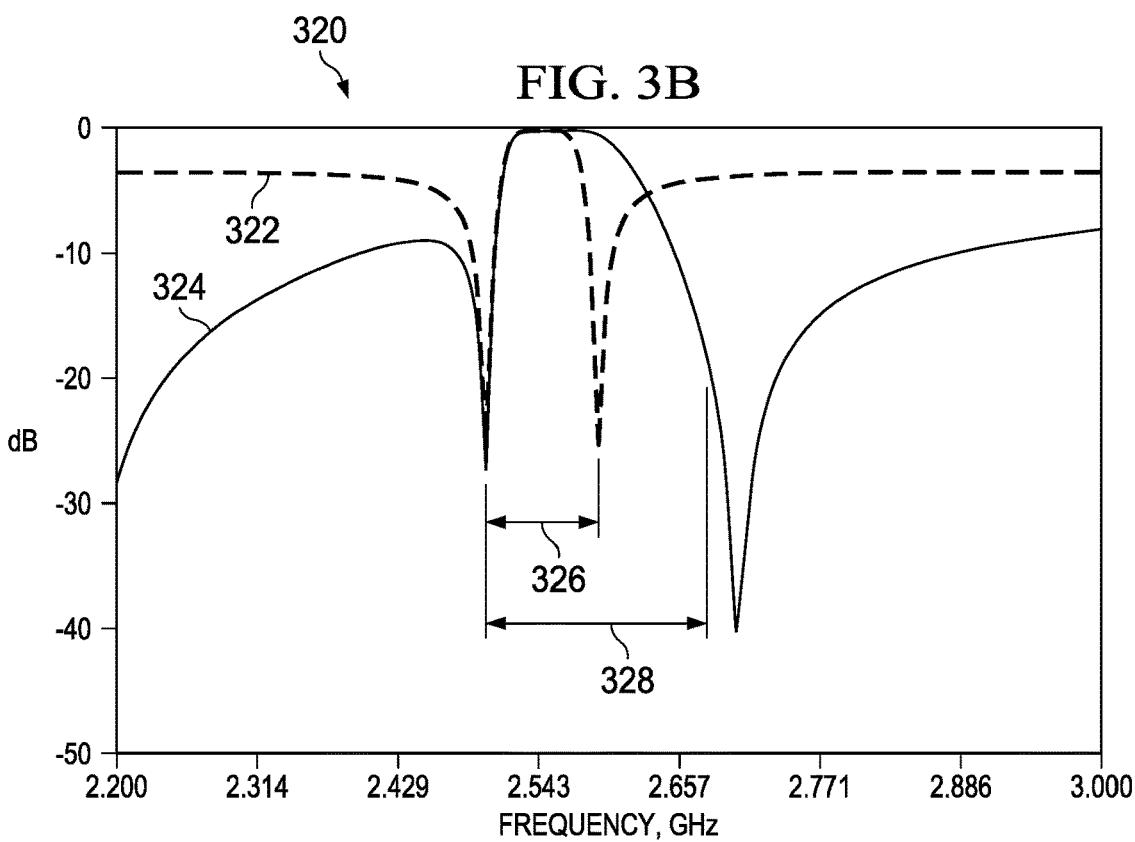
FIG. 3B is a graph of bandwidth for the filter circuit of FIG. 3A.

FIG. 3B is a graph 320 of bandwidth for the filter circuit 300. The bandwidth of the filter circuit 300 is illustrated as curve 324, and the bandwidth of a BAW resonator filter using a lower Q inductor is illustrated as curve 322. As shown by the curves 322 and 324, the bandwidth of the filter circuit 300 (using the high Q inductor formed on the die 301) substantially exceeds the bandwidth of the filter using the lower Q inductor.

Figure 4A:
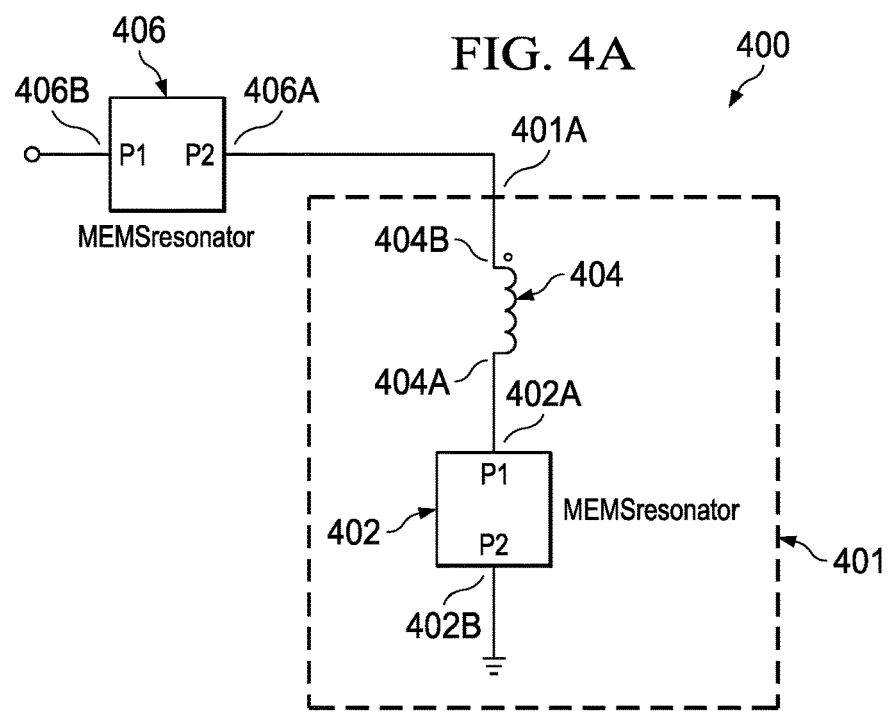
FIG. 4A is a schematic diagram for a filter circuit that includes a BAW resonator in series with a high-Q inductor.

FIG. 4A is a schematic diagram for a filter circuit 400 that includes a BAW resonator 402 in series with a high Q inductor 404 (both are in a parallel branch), and a BAW resonator 406 in a series branch. The BAW resonator 402 and the inductor 404 may be disposed on a same die 401, as shown in FIG. 1B. The filter circuit 400 also includes a second BAW resonator 406. The BAW resonator 406 may be disposed on the die 401, or disposed on a different die. The inductor 404 is fabricated using a bump process. The metal layer deposited to form the inductor 404 may be 30-100 micrometers thick. The inductor 404 may have Q factor in a range of about 30-50 in some implementations. The die 401 includes an I/O terminal 401A that is fabricated using the bump process. The inductor 404 includes terminals 404A and 404B respectively coupled to terminal 402A of the BAW resonator 402 and I/O terminal 401A of the die 401. The BAW resonator 406 includes a terminal 406A coupled to the 301A and a terminal 406B.

Figure 4B:
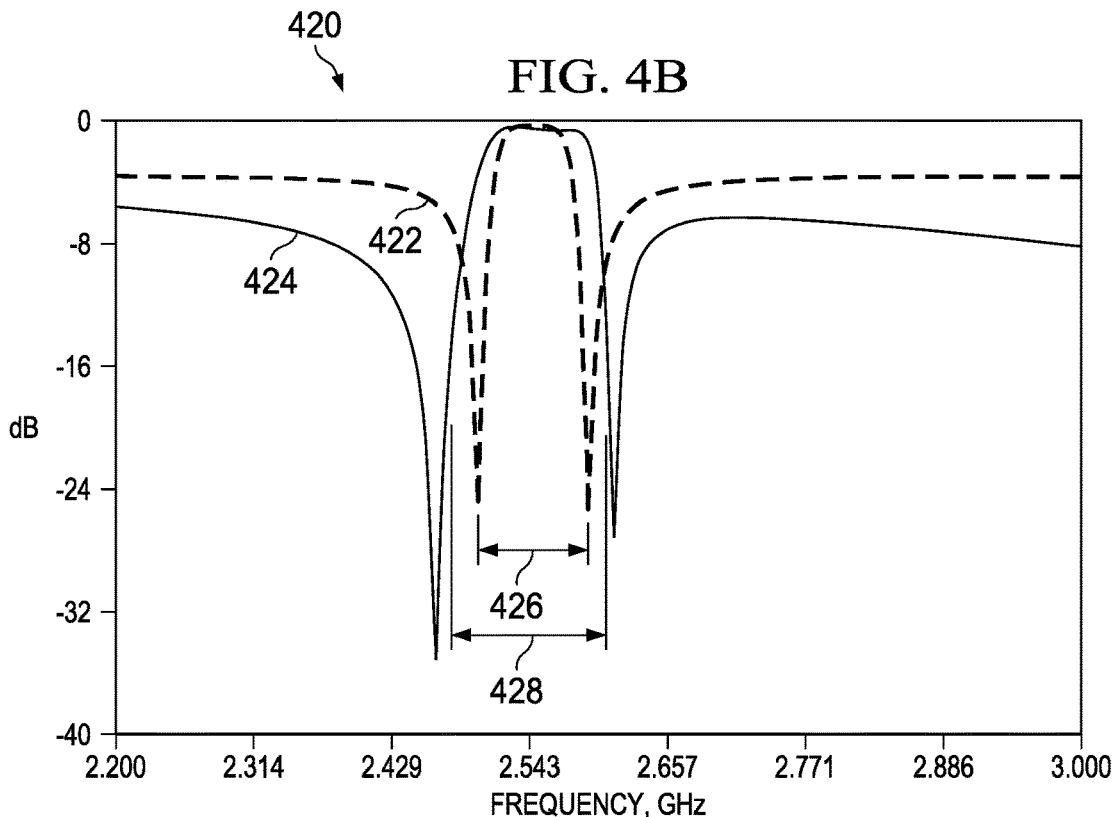
FIG. 4B is a graph of bandwidth for the filter circuit of FIG. 4A.

FIG. 4B is a graph 420 of bandwidth for the filter circuit 400. The bandwidth of the filter circuit 400 is illustrated as curve 424, and the bandwidth of a BAW resonator filter using a lower Q inductor is illustrated as curve 422. As shown by the curves 422 and 424, the bandwidth of the filter circuit 400 (using the high-Q inductor formed on the die 401) substantially exceeds the bandwidth of the filter using the lower Q inductor.

Figure 5A:
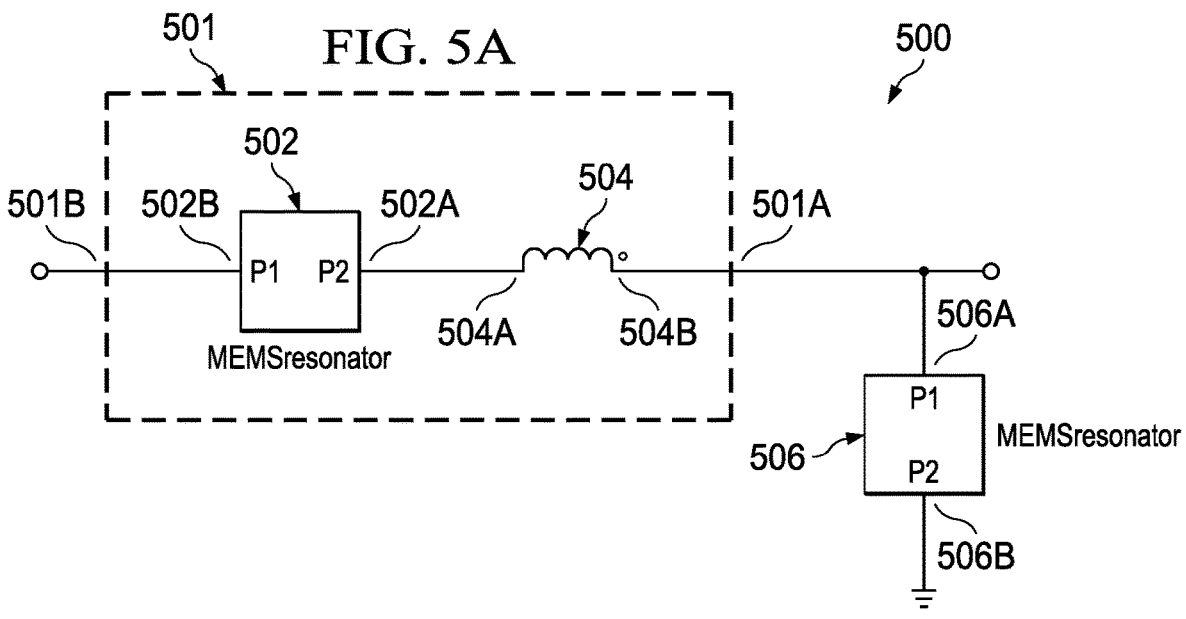
FIG. 5A is a schematic diagram for a filter circuit that includes a BAW resonator in series with a high-Q inductor.

FIG. 5A is a schematic diagram for a filter circuit 500 that includes a BAW resonator 502 in series with a high-Q inductor 504 (both are in a series branch), and a BAW resonator 506 in a parallel branch. The BAW resonator 502 and the inductor 504 may be disposed on a same die 501, as shown in FIG. 1B. The filter circuit 500 also includes a second BAW resonator 506. The BAW resonator 506 may be disposed on the die 501, or disposed on a different die. The inductor 504 is fabricated using a bump process. The metal layer deposited to form the inductor 504 may be 30-100 micrometers thick. The inductor 504 may have Q factor in a range of about 30-50 in some implementations. The die 501 includes I/O terminals 501A and 501B that are fabricated using the bump process. The inductor 504 includes terminals 504A and 504B respectively coupled to terminal 502A of the BAW resonator 502 and terminal 501A of the die 501. The I/O terminal 501B is coupled to a terminal 502B of the BAW resonator 502. The BAW resonator 506 includes a terminal 506A coupled to the I/O terminal 501A and a terminal 506B coupled to ground.

Figure 5B:
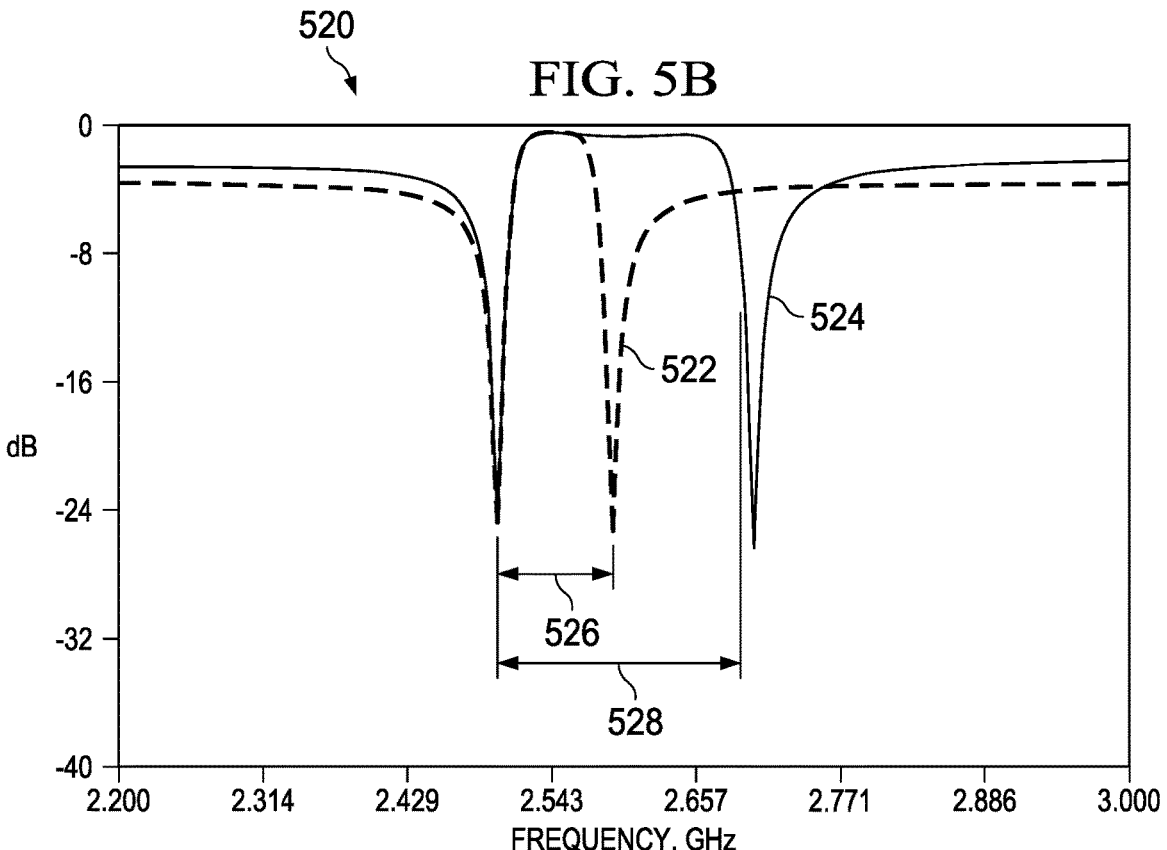
FIG. 5B is a graph of bandwidth for the filter circuit of FIG. 5A.

FIG. 5B is a graph 520 of bandwidth for the filter circuit 500. The bandwidth of the filter circuit 500 is illustrated as curve 524, and the bandwidth of a BAW resonator filter using a lower Q inductor is illustrated as curve 522. As shown by the curves 522 and 524, the bandwidth of the filter circuit 500 (using the high Q inductor formed on the die 501) substantially exceeds the bandwidth of the filter using the lower Q inductor.

Figure 6A:
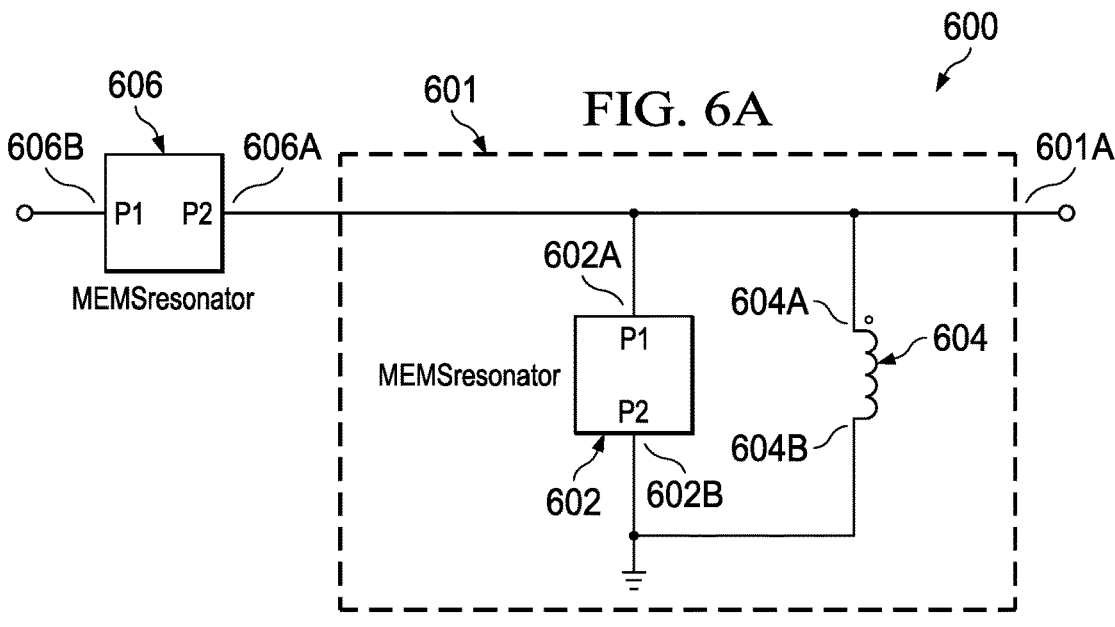
FIG. 6A is a schematic diagram for a filter circuit that includes a BAW resonator in parallel with a high-Q inductor.

FIG. 6A is a schematic diagram for a filter circuit 600 that includes a BAW resonator 602 in parallel with a high-Q inductor 604 (both are in a parallel branch), and a BAW resonator 606 in a series branch. The BAW resonator 602 and the inductor 604 may be disposed on a same die 601, as shown in FIG. 1B. The filter circuit 600 also includes a second BAW resonator 606. The BAW resonator 606 may be disposed on the die 601, or disposed on a different die. The inductor 604 is fabricated using a bump process. The metal layer deposited to form the inductor 604 may be 30-100 micrometers thick. The inductor 604 may have Q factor in a range of about 30-50 in some implementations. The die 601 includes an I/O terminal 601A that is fabricated using the bump process. The inductor 604 includes terminals 604A and 604B respectively coupled to terminals 602A and 602B of the BAW resonator 602, terminal 606A of the BAW resonator 606, and I/O terminal 601A of the die 601. Terminal 604B of the inductor 604 is coupled to ground.

Figure 6B:
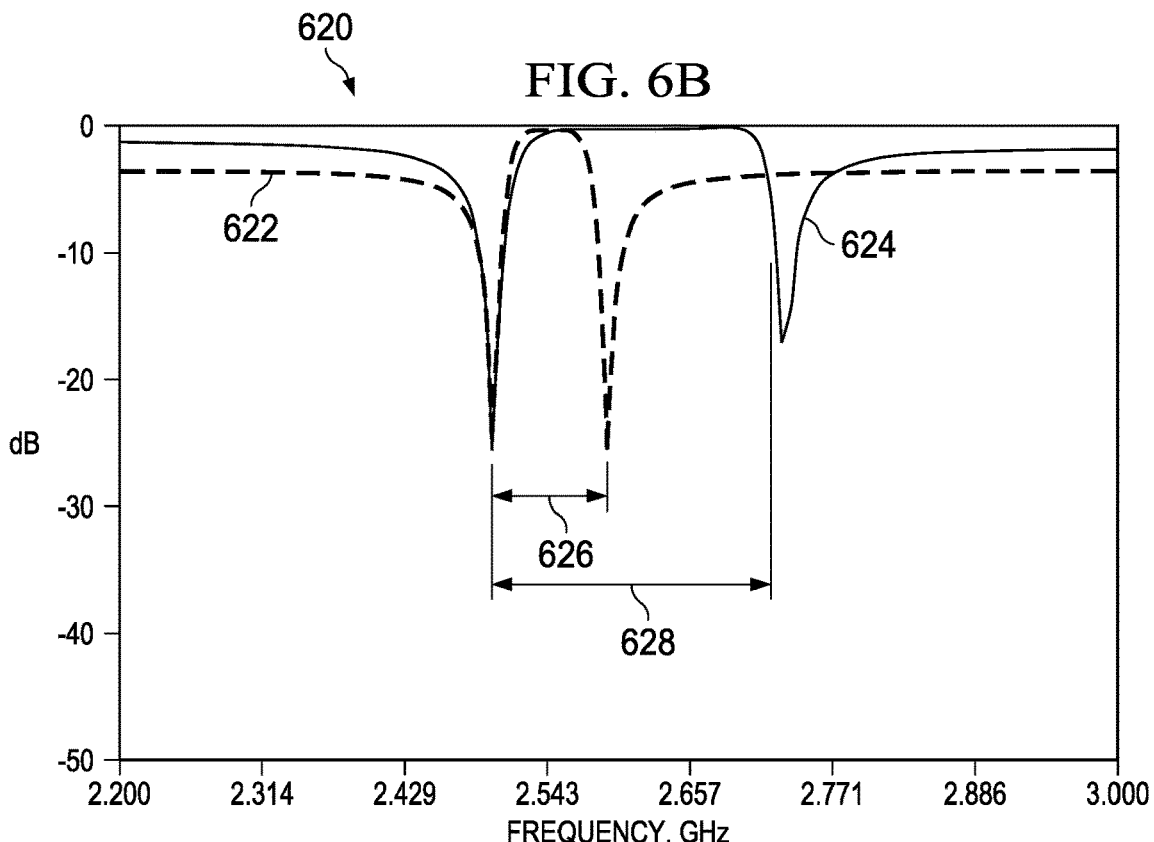
FIG. 6B is a graph of bandwidth for the filter circuit of FIG. 6A.

FIG. 6B is a graph 620 of bandwidth for the filter circuit 600. The bandwidth of the filter circuit 600 is illustrated as curve 624, and the bandwidth of a BAW resonator filter using a lower Q inductor is illustrated as curve 622. As shown by the curves 622 and 624, the bandwidth of the filter circuit 600 (using the high Q inductor formed on the die 601) substantially exceeds the bandwidth of the filter using the lower Q inductor.

Figures 7, 9:
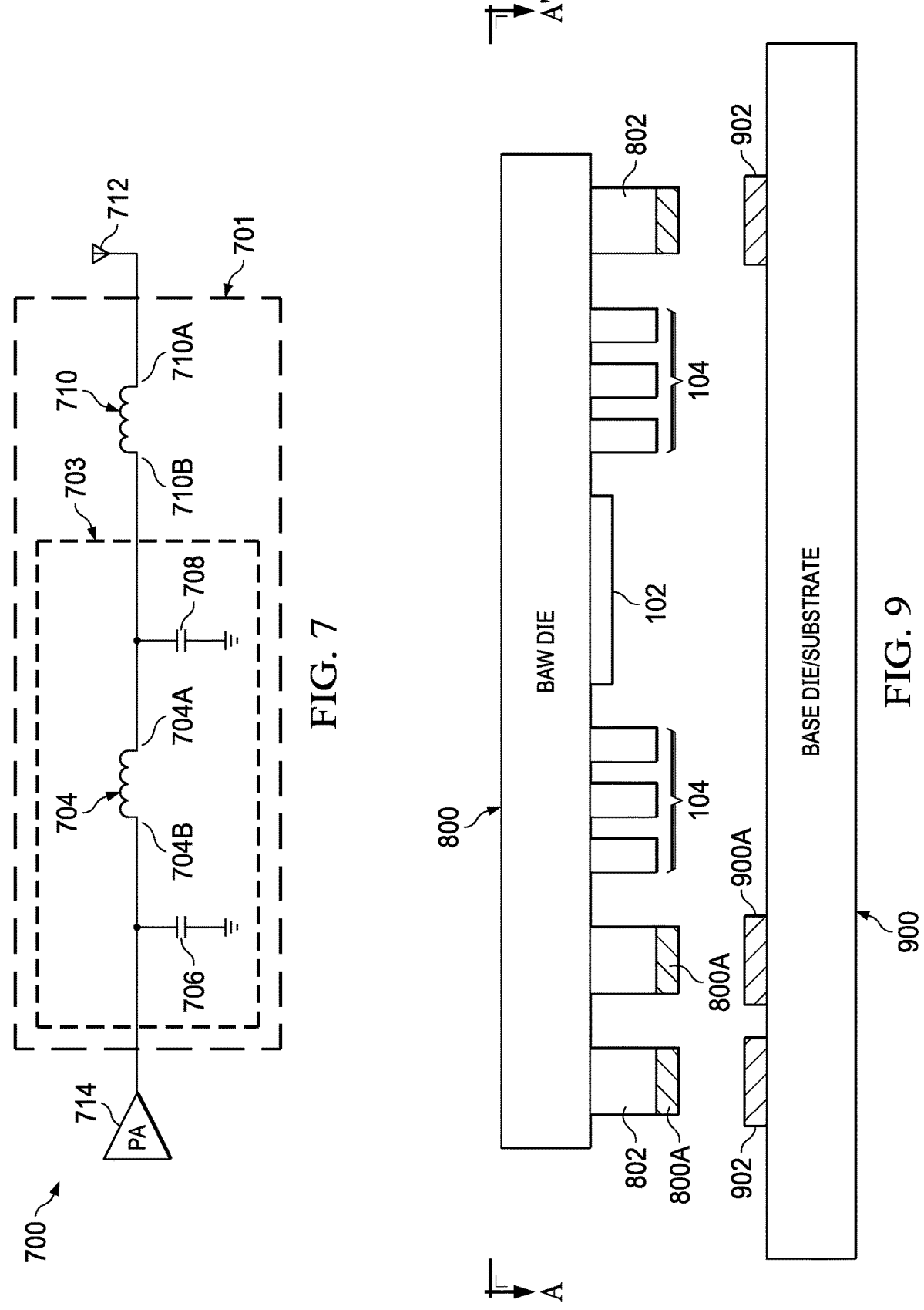
FIG. 7 is a schematic diagram for a radio frequency circuit that includes an integrated passive device.
FIG. 9 shows a cross-sectional view of the die of FIG. 8 aligned for attachment to a base die.

FIG. 7 is a schematic diagram for a radio frequency circuit 700 that includes an integrated passive device as described herein. The radio frequency circuit 700 includes a power amplifier 714, an antenna 712, a matching network 703, and an inductor 710. The matching network 703 matches the impedances of the power amplifier 714 and antenna 712. The inductor 710 increases the length of the antenna 712 to allow for reduction in size of the antenna 712.

The matching network 703 and the inductor 710 may be formed on a die 701. The matching network 703 includes an inductor 704, a capacitor 706, and a capacitor 708. The inductors 704 and 710, and the capacitors 706 and 708 are fabricated using a bump process. The metal layer deposited to form the inductors 704 and 710, and the capacitors 706 and 708 may be 30-100 micrometers thick. The capacitors 706 and 708 may be patterned as interdigital capacitors. The inductors 704 and 710 may have a Q factor in a range of about 30-50 in some implementations.

A terminal 704B of the inductor 704 is coupled to the capacitor 706 and an output of the power amplifier 714. A terminal 704A of the inductor 704 is coupled to the capacitor 708 and terminal 710B of the inductor 710. Terminal 710A of the inductor 710 is coupled to the antenna 712. By disposing the matching network 703 and the inductor 710 on the die 701, the size and cost of the radio frequency circuit 700 may be reduced. In various implementations of the radio frequency circuit 700, the matching network 703 and/or the inductor 710 may be disposed on the die 701.

Figure 8:
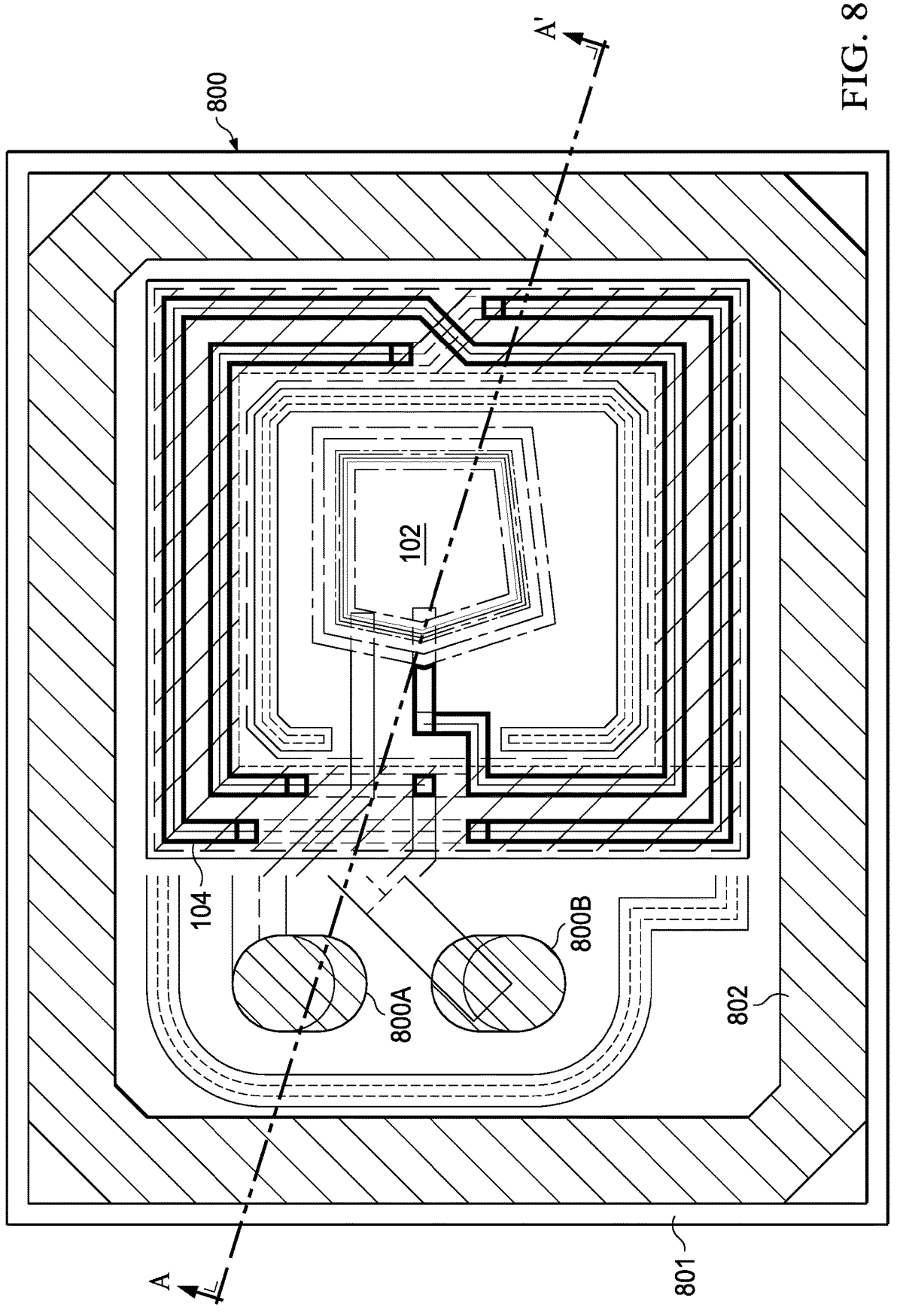
FIG. 8 shows a die having a BAW resonator, an inductor, I/O terminals, and solder seal.

FIG. 8 shows a die 800. The die 800 includes a substrate 801. The BAW resonator 102, the inductor 104, I/O terminals 800A and 800B, and the seal ring 802 are formed on the substrate 801. The inductor 104, the I/O terminal 800A, the I/O terminal 800B, and the seal ring 802 are formed using a bump process to pattern a relatively thick metal layer. The seal ring 802 encircles the BAW resonator 102, the inductor 104, the I/O terminal 800A and the I/O terminal 800B.

FIG. 9 shows a cross-sectional view of the die 800 and a base die 900. The die 900 includes a seal ring 902 and an I/O terminal 900A. The I/O terminal 900A is attached to the I/O terminal 800A by solder reflow to allow transfer of signal between the die 800 and the base die 900. The seal ring 902 is attached to the seal ring 802 by solder reflow to seal the BAW resonator 102, the inductor 104, and the I/O terminal 800A within the seal ring 802 and between the die 800 and the base die 900.

In this description, the term "couple" or "couples" may cover connections, communications, or signal paths that enable a functional relationship consistent with this description. For example, if device A generates a signal to control device B to perform an action: (a) in a first example, device A is coupled to device B; or (b) in a second example, device A is coupled to device B through intervening component C if intervening component C does not substantially alter the functional relationship between device A and device B, such that device B is controlled by device A via the control signal generated by device A. Also, in this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. A circuit, comprising:
   a semiconductor substrate;
   an inductor over the semiconductor substrate;
   a resonator on the semiconductor substrate, the resonator coupled in series with the inductor; and
   a seal ring over the semiconductor substrate and at least partially surrounding the inductor, the seal ring and the inductor made of a same material.

2. The circuit of claim 1, wherein the resonator is a first resonator, and the circuit includes a second resonator coupled to the first resonator.

3. The circuit of claim 2, wherein the inductor is coupled between the first and second resonators.

4. The circuit of claim 1, wherein the inductor and the seal ring have a same thickness.

5. The circuit of claim 1, further comprising a second substrate coupled to the seal ring via solder.

6. The circuit of claim 1, further comprising:
   a first I/O terminal over the semiconductor substrate; and
   a second I/O terminal over the semiconductor substrate;
   wherein:
      the inductor includes:
         a first terminal coupled to the first I/O terminal; and
         a second terminal; and
      the resonator includes:
         a first terminal coupled to the second terminal of the inductor; and
         a second terminal coupled to the second I/O terminal.

7. The circuit of claim 1, wherein the seal ring includes a copper post or a copper bump.

8. The circuit of claim 1, further comprising:
   a first I/O terminal over the semiconductor substrate; and
   a second I/O terminal over the semiconductor substrate; and
   wherein:
      the inductor includes:
         a first terminal coupled to the first I/O terminal; and
         a second terminal coupled to the second I/O terminal.

9. The circuit of claim 1, further comprising:
   a first I/O terminal over the semiconductor substrate;
   a second I/O terminal over the semiconductor substrate; and
   a capacitor over the semiconductor substrate; and wherein:

the inductor includes:

a first terminal coupled to the first I/O terminal; and a second terminal coupled to the second I/O terminal and a terminal of the capacitor.

10. The circuit of claim 9, wherein:

the inductor is a first inductor; and the circuit includes:

a second inductor over the semiconductor substrate; and the second inductor includes:

a first terminal coupled to the first terminal of the first inductor; and a second terminal coupled to the second I/O terminal.

11. The circuit of claim 1, wherein the resonator is a micro-electro-mechanical system (MEMS) resonator.

12. The circuit of claim 11, wherein the MEMS resonator is a bulk acoustic wave (BAW) resonator.

13. The circuit of claim 1, wherein the inductor is at least 30 micrometers thick.

14. A circuit, comprising:

a semiconductor substrate;

a resonator over the semiconductor substrate;

an inductor over the semiconductor substrate, in which the inductor is coupled in series to the resonator; and a seal ring over the semiconductor substrate, in which the seal ring at least partially laterally surrounds the inductor and the resonator.

15. The circuit of claim 14, further comprising a base die coupled to the seal ring, wherein the base die is spaced from the inductor.

16. The circuit of claim 14, further comprising:

a first I/O terminal over the semiconductor substrate; and a second I/O terminal over the semiconductor substrate; and wherein:

the inductor includes:

a first terminal coupled to the first I/O terminal; and a second terminal coupled to the second I/O terminal.

17. The circuit of claim 14, further comprising:

a first I/O terminal over the semiconductor substrate; and a second I/O terminal over the semiconductor substrate;

wherein:

the inductor includes:

a first terminal coupled to the first I/O terminal; and a second terminal;

the resonator includes:

a first terminal coupled to the second terminal of the inductor; and a second terminal coupled to the second I/O terminal.

18. A circuit, comprising:

a first die including a semiconductor substrate;

a first I/O terminal over the semiconductor substrate;

a second I/O terminal over the semiconductor substrate;

a passive device over the semiconductor substrate and includes a terminal coupled to the first I/O terminal;

a seal ring that surrounds the passive device, the first I/O terminal, and the second I/O terminal, the seal ring having a same material as the passive device and the first and second I/O terminals; and a second die coupled to first I/O terminal and to the second I/O terminal, in which at least part of the passive device is spaced from at least one of the first or second dies.

19. The circuit of claim 18, wherein the terminal of the passive device is a first terminal, the circuit further comprising:

a capacitor over the semiconductor substrate, and the capacitor includes a terminal coupled to the terminal of the passive device; and wherein the passive device includes a second terminal coupled to the second I/O terminal.

20. The circuit of claim 19, wherein the passive device is a first inductor, the circuit further comprising a second inductor over the semiconductor substrate and wherein the second inductor includes:

a first terminal coupled to the first terminal of the first inductor; and a second terminal coupled to the second I/O terminal.

\* \* \* \* \*